United States Patent
Slater, Jr. et al.

(10) Patent No.: US 6,747,298 B2
(45) Date of Patent: Jun. 8, 2004

(54) COLLETS FOR BONDING OF LIGHT EMITTING DIODES HAVING SHAPED SUBSTRATES

(75) Inventors: David B. Slater, Jr., Raleigh, NC (US); Jayesh Bharathan, Santa Barbara, CA (US); John Edmond, Cary, NC (US); Mark Raffetto, Santa Barbara, CA (US); Anwar Mohammed, San Jose, CA (US); Peter S. Andrews, Greensboro, NC (US); Gerald H. Negley, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/185,350

(22) Filed: Jun. 27, 2002

(65) Prior Publication Data

US 2003/0042507 A1 Mar. 6, 2003

Related U.S. Application Data

(60) Provisional application No. 60/307,234, filed on Jul. 23, 2001.

(51) Int. Cl.$^7$ ................................. H01L 31/0328
(52) U.S. Cl. .............. 257/200; 257/190; 257/E21.122; 257/E33.054; 438/22; 438/46; 438/507
(58) Field of Search .............. 257/200, E25.02, 257/E33.007, 88, 99, 190, E21.122, E33.054; 356/352, 400; 438/22, 46, 507

(56) References Cited

U.S. PATENT DOCUMENTS 5,046,161 A  9/1991  Takada .................. 357/69
5,060,027 A  10/1991  Hart et al. ............. 357/17

(List continued on next page.)

FOREIGN PATENT DOCUMENTS

| EP | 0589524 A2 | 3/1994 | |
| EP | 0843365 | 5/1998 | |
| JP | 02206136 | 8/1990 | |
| JP | 04152645 | 5/1992 | |
| JP | 05029364 | 2/1993 | |
| JP | 10012929 | * 1/1998 | ........... H01L/33/00 |
| WO | WO 01/47039 | 6/2001 | |
| WO | WO-3010798 | * 2/2003 | ........... H01L/21/00 |

OTHER PUBLICATIONS

Copy of International Search Report for PCT/US02/23067, dated Jun. 4, 2003.

(List continued on next page.)

*Primary Examiner*—David Nelms
*Assistant Examiner*—Dao H. Nguyen
(74) *Attorney, Agent, or Firm*—Myers Bigel Sibley & Sajovec, P.A.

(57) ABSTRACT

Bonding of flip-chip mounted light emitting devices having an irregular configuration is provided. Light emitting diodes having a shaped substrate are bonded to a submount by applying forces to the substrate an a manner such that shear forces within the substrate do not exceed a failure threshold of the substrate. Bonding a light emitting diode to a submount may be provided by applying force to a surface of a substrate of the light emitting diode that is oblique to a direction of motion of the light emitting diode to thermosonically bond the light emitting diode to the submount. Collets for use in bonding shaped substrates to a submount and systems for bonding shaped substrates to a submount are also provided.

36 Claims, 6 Drawing Sheets

U.S. PATENT DOCUMENTS

| | | | |
|---|---|---|---|
| 5,117,279 A | | 5/1992 | Karpman .................... 357/72 |
| 5,118,584 A | | 6/1992 | Evans et al. ................ 430/313 |
| 5,161,166 A | * | 11/1992 | Shima et al. ................. 372/45 |
| 5,438,477 A | | 8/1995 | Pasch ......................... 361/689 |
| 5,506,451 A | | 4/1996 | Hyugaji ...................... 257/778 |
| 5,672,542 A | | 9/1997 | Schwiebert ................. 437/183 |
| 5,694,482 A | | 12/1997 | Maali et al. ................ 382/151 |
| 5,760,479 A | | 6/1998 | Yang et al. ................. 257/778 |
| 5,773,882 A | | 6/1998 | Iwasaki ...................... 257/692 |
| 5,909,280 A | * | 6/1999 | Zavracky .................... 356/454 |
| 5,926,726 A | * | 7/1999 | Bour et al. ................. 438/507 |
| 6,057,222 A | | 5/2000 | Pahl et al. .................. 438/612 |
| 6,146,984 A | | 11/2000 | Leibovitz et al. ........... 438/613 |
| 6,189,772 B1 | | 2/2001 | Hembree .................... 228/254 |
| 6,213,789 B1 | | 4/2001 | Chua et al. .................... 439/81 |
| 6,214,733 B1 | | 4/2001 | Sickmiller ................... 438/691 |
| 6,222,279 B1 | | 4/2001 | Mis et al. ................... 257/779 |
| 6,224,690 B1 | | 5/2001 | Andricacos ................ 148/400 |
| 6,323,052 B1 | * | 11/2001 | Horie et al. ................... 438/46 |

OTHER PUBLICATIONS

Abstract. "Thermosonic bonding: an alternative to area–array solder connections," Sa Yoon Kang, Teh–hua Ju, and Y. C. Lee, Electronic Components and Technology Conference, Florida, Jun. 2–4, 1993, XP–002241923.

Abstract. "Light emitting diode holder for various electrical instrument LED mounting," A. N. Soldatenkov, Derwent Publications Ltd, London, GB, AN 1995–013018, Jul. 15, 1993, XP–002241924.

Epoxy Technology: Products—B Stage. http://www.epotek.com/b stage.html. Feb. 27, 2002.

B–Definitions: B Stage. http://www.isl–garnet.uah.edu/Composites/b.html. Feb. 27, 2002.

* cited by examiner

COLLETS FOR BONDING OF LIGHT EMITTING DIODES HAVING SHAPED SUBSTRATES

RELATED APPLICATIONS

The present application claims priority from U.S. Provisional Patent Application Serial No. 60/307,234 entitled "THERMOSONIC BONDING OF FLIP CHIP LIGHT EMITTING DIODES" and filed Jul. 23, 2001, the disclosure of which is incorporated herein by reference as if set forth fully.

FIELD OF THE INVENTION

The present invention relates to semiconductor devices, and more particularly to devices for use in mounting semiconductor devices to a submount in a flip-chip configuration.

BACKGROUND OF THE INVENTION

GaN-based light emitting diodes (LEDs) typically comprise an insulating or semiconducting substrate such as SIC or sapphire on which a plurality of GaN-based epitaxial layers are deposited. The epitaxial layers comprise an active region having a p-n junction that emits light when energized. A typical LED is mounted substrate side down onto a submount, also called a package or lead frame (hereinafter referred to as a "submount"). FIG. 1 schematically illustrates a conventional LED having an n-type SiC substrate 10, an active region 12 comprising an n-GaN-based layer 14 and a p-GaN-based layer 16 grown on the substrate and patterned into a mesa. A metal p-electrode 18 is deposited on the p-GaN layer 16 and a wire bond connection 28 is made to a bond pad 20 on the p-electrode 18. An n-electrode 22 on the conductive substrate is attached to metallic submount 24 using a conductive epoxy 26. In the conventional process, the conductive epoxy 26 (usually silver epoxy) is deposited on the submount and the LED is pressed into the epoxy 26. The epoxy is then heat cured which causes it to harden, providing a stable and electrically conductive mount for the LED chip. Light generated in the active region 12 is directed up and out of the device. However, a substantial amount of the generated light may be transmitted into the substrate and absorbed by the epoxy 26.

Flip-chip mounting of LEDs involves mounting the LED onto the submount substrate side up. Light is then extracted and emitted through the transparent substrate. Flip chip mounting may be an especially desirable technique for mounting SiC-based LEDs. Since SiC has a higher index of refraction than GaN, light generated in the active region does not internally reflect (i.e. reflect back into the GaN-based layers) at the GaN/SiC interface. Flip chip mounting of SiC-based LEDs may improve the effect of certain chip-shaping techniques known in the art. Flip chip packaging of SiC LEDs may have other benefits as well, such as improved heat dissipation, which may be desirable depending on the particular application for the chip.

One problem with flip-chip mounting is illustrated in FIG. 2. Namely, when a chip is flip-chip mounted on a conductive submount or package using conventional techniques, a conductive die attach material 26 is deposited on the chip and/or on the submount 24, and the chip is pressed into the submount 24. This can cause the viscous conductive die attach material 26 to squeeze out and make contact with the n-type layers 14 and 10 in the device, thereby forming a Schottky diode connection that short-circuits the p-n junction in the active region with predictably undesirable results. Thus, improvements in the flip-chip mounting of LEDs may be desirable.

SUMMARY OF THE INVENTION

Embodiments of the present invention provide for bonding of flip-chip mounted light emitting devices having an irregular configuration. Certain embodiments of the present invention bond a light emitting diode having a shaped substrate to a submount by applying forces to the substrate in a manner such that shear forces within the substrate do not exceed a failure threshold of the substrate. Such bonding may, for example, be provided by thermosonic and/or thermocompression bonding. In certain embodiments of the present invention, a light emitting diode is bonded to a submount is by applying force to a surface of a substrate of the light emitting diode that is oblique to a direction of motion of the light emitting diode to bond the light emitting diode to the submount.

In particular embodiments of the present invention, force is applied to the shaped substrate by mating a collet to the surface of the substrate oblique to the direction of motion and moving the collet in the direction of motion. Such a mating of the collet may be provided by seating a collet having a mating surface corresponding to an oblique surface of the substrate so that the mating surface of the collet contacts the oblique surface of the substrate. In certain embodiments of the present invention, the mating surface of the collet is a fixed surface relative to a body of the collet. In other embodiments of the present invention, the mating surface of the collet is a moveable surface relative to a body of the collet.

In still further embodiments of the present invention the collet is seated by placing the collet over the light emitting diode and applying a vacuum pressure to the collet. In certain embodiments of the present invention, the light emitting diode is a gallium nitride based light emitting diode having a silicon carbide shaped substrate. In particular, the silicon carbide shaped substrate may have a cubic portion and a truncated pyramidal portion adjacent the cubic portion. In such cases, force is applied to sidewalls of the truncated pyramidal portion of the silicon carbide substrate.

In additional embodiments of the present invention, a collet for bonding light emitting diodes having a shaped substrate to a submount is provided. The collet has a body having a chamber therein and an opening in communication with the chamber and adapted to receive the light emitting diode. The collet also includes means for mating surfaces of the collet to surfaces of the shaped substrate that are oblique to a direction of motion of the collet.

In certain embodiments of the present invention, the means for mating surfaces of the collet to the shaped substrate is provided by fixed surfaces of the collet defining the opening and disposed at an angle corresponding to an angle of the surfaces of the shaped substrate that are oblique to the direction of motion. Furthermore, the body may include a top portion and vertical side portions defining the chamber and an opening for inducing a vacuum in the chamber.

In further embodiments of the present invention, the body includes spaced apart side portions defining the chamber. In such embodiments, the fixed surfaces of the collet may be provided by angled surfaces at a terminus of the side portions. Furthermore, the side portions may be spaced apart a distance corresponding to a dimension of the surfaces of the shaped substrate that are oblique to the direction of motion. In such embodiments, the body may also include a top portion and an opening for inducing a vacuum pressure in the chamber. The side portions may then be vertical side portions.

In still further embodiments of the present invention, the body includes a top portion and vertical side portions defining the chamber and an opening for inducing a vacuum in the chamber. In such embodiments, the side portions may be horizontal side portions that extend from the vertical side portions and are spaced apart from the top portion.

In additional embodiments of the present invention, the means for mating surfaces of the collet to the shaped substrate is provide by surfaces of the collet defining the opening and that are moveable with respect to the body and are configured to adjust to an angle corresponding to an angle of the surfaces of the shaped substrate that are oblique to the direction of motion. In such embodiments, the body may include a top portion and vertical side portions defining the chamber and an opening for inducing a vacuum in the chamber. Furthermore, the body may include spaced apart horizontal side portions. In such a case, the moveable surfaces of the collet may be provided by moveable end portions of the horizontal side portions, the moveable end portions being configured to substantially conform to the angle of the shaped substrate and are spaced apart a distance corresponding to a dimension of the surfaces of the shaped substrate that are oblique to the direction of motion.

In certain embodiments of the present invention, the moveable end portions are hinged to rotate about an end of the horizontal side portions. In further embodiments of the present invention, the body further includes a top portion and vertical side portions that connect the top portion to the horizontal side portions defining the chamber and an opening for inducing a vacuum pressure in the chamber. The horizontal side portions may also be moveably connected to the vertical side portions. For example, the horizontal side portions may be hinged to the vertical side portions.

In particular embodiments of the present invention, the collet is adapted for use with a gallium nitride based light emitting diode having a silicon carbide shaped substrate. The collet may also be adapted for use with a silicon carbide shaped substrate having a truncated pyramidal portion and wherein the means for mating comprises means for mating surfaces of the collet to sidewalls of the truncated pyramidal portion of the shaped silicon carbide substrate.

Still further embodiments of the present invention provide a collet for bonding a light emitting diode having a shaped substrate to a submount. The collet includes a body having a chamber therein and an opening in the body in communication with the chamber configured such that a portion of the shaped substrate extends into the chamber without contacting the body. The colet further includes means, operably associated with the chamber, for engaging the substrate to bond the light emitting diode to the submount while maintaining internal shear forces of the substrate below a shear failure threshold of the substrate.

In some embodiments of the present invention, the means for engaging is provided by fixed surfaces of the collet defining the opening and disposed at an angle corresponding to an angle of the surfaces of the shaped substrate that are oblique to the direction of motion. In such embodiments, the body may include a top portion and vertical side portions defining the chamber and an opening for inducing a vacuum in the chamber. In other embodiments, the body includes spaced apart side portions defining the opening and wherein the fixed surfaces of the collet comprise angled surfaces at a terminus of the side portions, wherein the side portions are spaced apart a distance corresponding to a dimension of the surfaces of the shaped substrate that are oblique to the direction of motion. In such embodiments, the body may also include a top portion defining the chamber and an opening for inducing a vacuum in the chamber and the side portions may be vertical side portions. In still other embodiments of the present invention, the body includes a top portion and vertical side portions and an opening for inducing a vacuum in the chamber and the side portions are horizontal side portions that extend from the vertical side portions and are spaced apart from the top portion.

In additional embodiments of the present invention, the means for engaging is provided by moveable surfaces of the collet defining the opening and configured to adjust to an angle corresponding to an angle of the surfaces of the shaped substrate that are oblique to the direction of motion. In such embodiments, the body may include a top portion and vertical side portions defining the chamber and an opening for inducing a vacuum in the chamber. The body may also include spaced apart horizontal side portions and wherein the moveable surfaces of the collet are moveable end portions of the horizontal side portions, the moveable end portions being configured to substantially conform to the angle of the shaped substrate and being spaced apart a distance corresponding to a dimension of the surfaces of the shaped substrate that are oblique to the direction of motion to thereby define the opening. In certain embodiments, the moveable end portions are hinged to rotate about an end of the horizontal side portions. In such embodiments, the body may also include a top portion and an opening for inducing a vacuum in the chamber and vertical side portions that connect the top portion to the horizontal side portions. Furthermore, the horizontal side portions may also be moveably connected to the vertical side portions. For example, the horizontal side portions may be hinged to the vertical side portions.

In still other embodiments of the present invention, a collet for bonding a light emitting diode to a submount is provided having a body having a chamber therein, an opening in the body in communication with the chamber and configured to receive the light emitting diode and fixed surfaces of the collet at the opening that contact a shaped substrate of the light emitting diode, the fixed surfaces defining the opening and being disposed at an angle corresponding to an angle of the surfaces of the shaped substrate that are oblique to a direction of motion of the collet during bonding. In some embodiments of the present invention, the body includes spaced apart side portions and the fixed surfaces of the collet may be angled surfaces at a terminus of the side portions. The side portions are spaced apart a distance corresponding to a dimension of the surfaces of the shaped substrate that are oblique to the direction of motion. In additional embodiments of the present invention, the body includes a top portion and vertical side portions defining the chamber and an opening for inducing a vacuum in the chamber. In such embodiments, the side portions may be horizontal side portions that extend from the vertical side portions and are spaced apart from the top portion.

In further embodiments of the present invention, a collet for bonding a light emitting diode to a submount includes a body having a chamber therein, an opening in the body in communication with the chamber and configured to receive the light emitting diode and moveable surfaces of the collet at the opening that are moveable in relation to the body and that contact a shaped substrate, the moveable surfaces being configured to adjust to an angle corresponding to an angle of the surfaces of the shaped substrate that are oblique to a direction of motion of the collet during bonding. In certain embodiments of the present invention, the body includes spaced apart horizontal side portions and the moveable surfaces of the collet are moveable end portions of the horizontal side portions, the moveable end portions being configured to substantially conform to the angle of the shaped substrate and are spaced apart a distance corresponding to a dimension of the surfaces of the shaped substrate that are oblique to the direction of motion. In some embodiments, the moveable end portions are hinged to rotate about an end of the horizontal side portions. In other embodiments of the present invention, the body includes a top portion defining the chamber, an opening for inducing a vacuum in the chamber and vertical side portions that connect the top portion to the horizontal side portions. In such embodiments, the horizontal side portions may be moveably connected to the vertical side portions. For example, the horizontal side portions may be hinged to the vertical side portions.

In still other embodiments of the present invention, a system for bonding a light emitting diode having a shaped substrate to a submount is provided. The system includes means for engaging the substrate while maintaining internal shear forces of the substrate below a shear failure threshold of the substrate when force is applied to the shaped substrate to bond the light emitting diode to the submount and means for moving the means for engaging to apply force to the substrate to bond the light emitting diode to the substrate. In certain embodiments of the present invention, the means for engaging comprises means for contacting the shaped substrate on a surface of the shaped substrate that is oblique to a direction of motion of the shaped substrate. In additional embodiments of the present invention, the means for contacting is provided by walls of a collet that are in a fixed position with respect to a body of the collet, the collet being configured to receive the light emitting diode. In other embodiments of the present invention, the means for contacting is provided by walls of the collet that are moveable with respect to a body of the collet, the collet being configured to receive the light emitting diode.

In further embodiments of the present invention, a collet for bonding light emitting diodes having a shaped substrate to a submount is provided. The collet includes a body having a chamber and an opening in communication with the chamber and adapted to receive the light emitting diode. The opening has a portion proximate to the chamber and a portion distal to the chamber. The collet also has mating surfaces associated with the, opening and disposed at an oblique angle with regard to an axis connecting distal portions of the opening that mate to surfaces of the shaped substrate.

In additional embodiment, the mating surfaces are fixed surfaces of the collet defining the opening and disposed at an angle corresponding to an angle of the surfaces of the shaped substrate. Furthermore, the body may have a top portion and vertical side portions defining the chamber and an opening for inducing a vacuum in the chamber. The body may be spaced apart side portions defining the chamber and the fixed surfaces of the collet may be angled surfaces at a terminus of the side portions. The side portions are spaced apart a distance corresponding to a dimension of the surfaces of the shaped substrate to which the fixed surfaces mate. The body may also include a top portion and an opening for inducing a vacuum pressure in the chamber and the side portions may be vertical side portions. The side portions may also include horizontal side portions that extend from the vertical side portions and are spaced apart from the top portion.

In other embodiments of the present invention, the mating surfaces are provided by surfaces of the collet defining the opening and that are moveable with respect to the body and are configured to adjust to an angle corresponding to an angle of the surfaces of the shaped substrate to which the surfaces of the collet defining the opening mate. The body may include a top portion and vertical side portions defining the chamber and an opening for inducing a vacuum in the chamber. The body may also include spaced apart horizontal side portions and the moveable surfaces of the collet may be moveable end portions of the horizontal side portions. The moveable end portions may be configured to substantially conform to the angle of the shaped substrate and may be spaced apart a distance corresponding to a dimension of the surfaces of the shaped substrate to which the moveable end portions mate. The moveable end portions may be hinged to rotate about an end of the horizontal side portions. The body may also include vertical side portions that connect the top portion to the horizontal side portions defining the chamber. The horizontal side portions may be moveably connected to the vertical side portions. For example, the horizontal side portions may be hinged to the vertical side portions.

In certain embodiments of the present invention, the collet is adapted for use with a gallium nitride based light emitting diode having a silicon carbide shaped substrate. The collet may also be adapted for use with a silicon carbide shaped substrate having a truncated pyramidal portion and wherein the mating surfaces mate with angled sidewalls of the truncated pyramidal portion of the shaped silicon carbide substrate.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. Accordingly, the present invention is not limited to the relative size and spacing illustrated in the accompanying figures.

Embodiments of the present invention provide for bonding of an LED chip to a submount. Embodiments of the invention include methods for thermosonically and/or thermocompression bonding a shaped chip and collet designs for manipulating a shaped chip. In particular embodiments of the present invention, a chip or die may be picked up and/or bonded on a single tool and may utilize a single collet for picking up the die and for bonding the die thermosonically and/or through thermocompression.

Because of the high index of refraction of SiC, light passing through a SiC substrate tends to be totally internally reflected into the substrate at the surface of the substrate unless the light strikes the interface at a fairly low angle of incidence (i.e. fairly close to normal). The critical angle for total internal reflection depends on the material with which SiC forms the interface. It is possible to increase the light output from a SiC-based LED by shaping the SiC substrate in a manner than limits total internal reflection by causing more rays to strike the surface of the SiC at low angles of incidence. One such chip shaping technique and resulting chip is shown in U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," which is hereby incorporated by reference.

Figure 1:
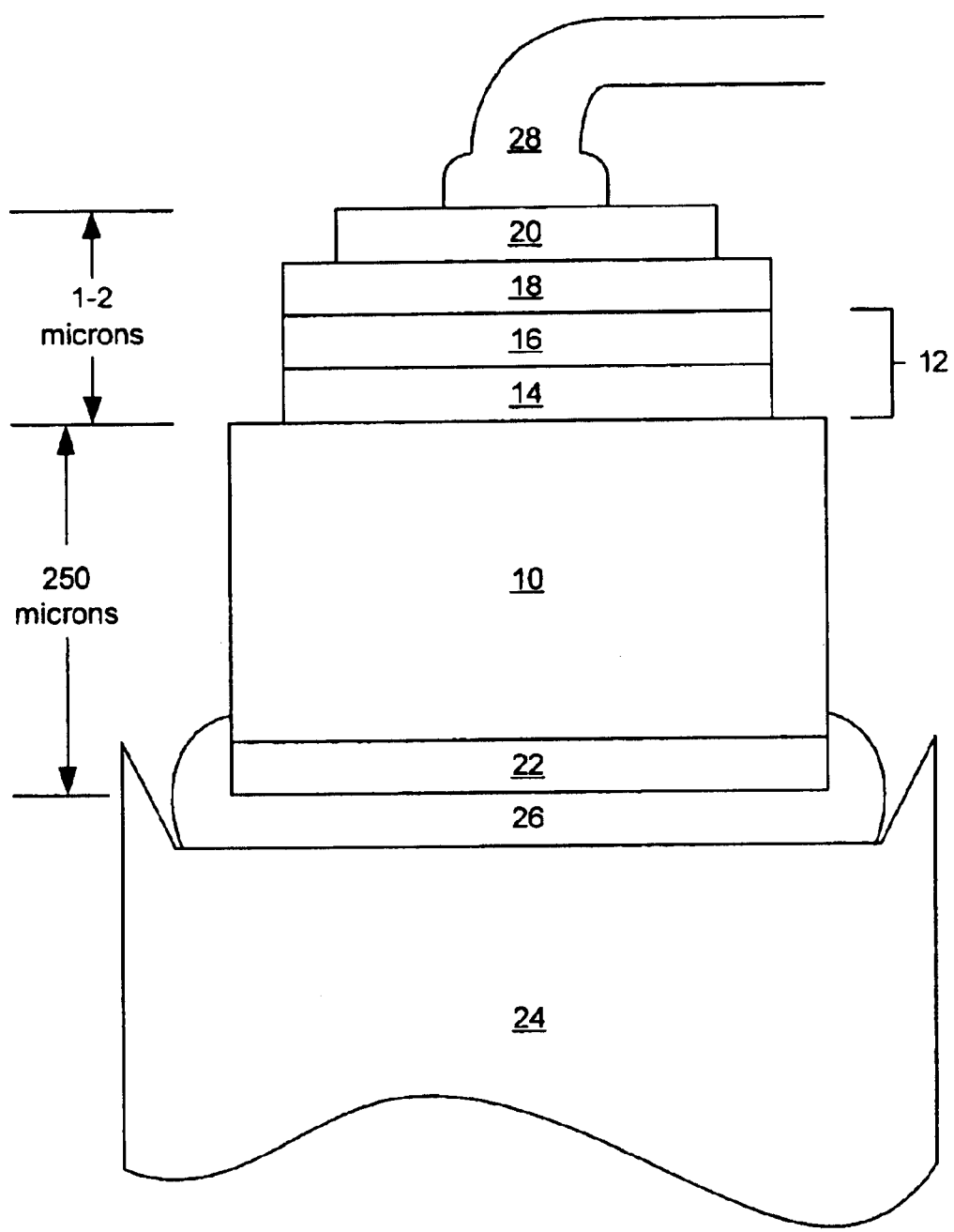
FIG. 1 is a schematic illustration of a convention LED.
Figure 2:
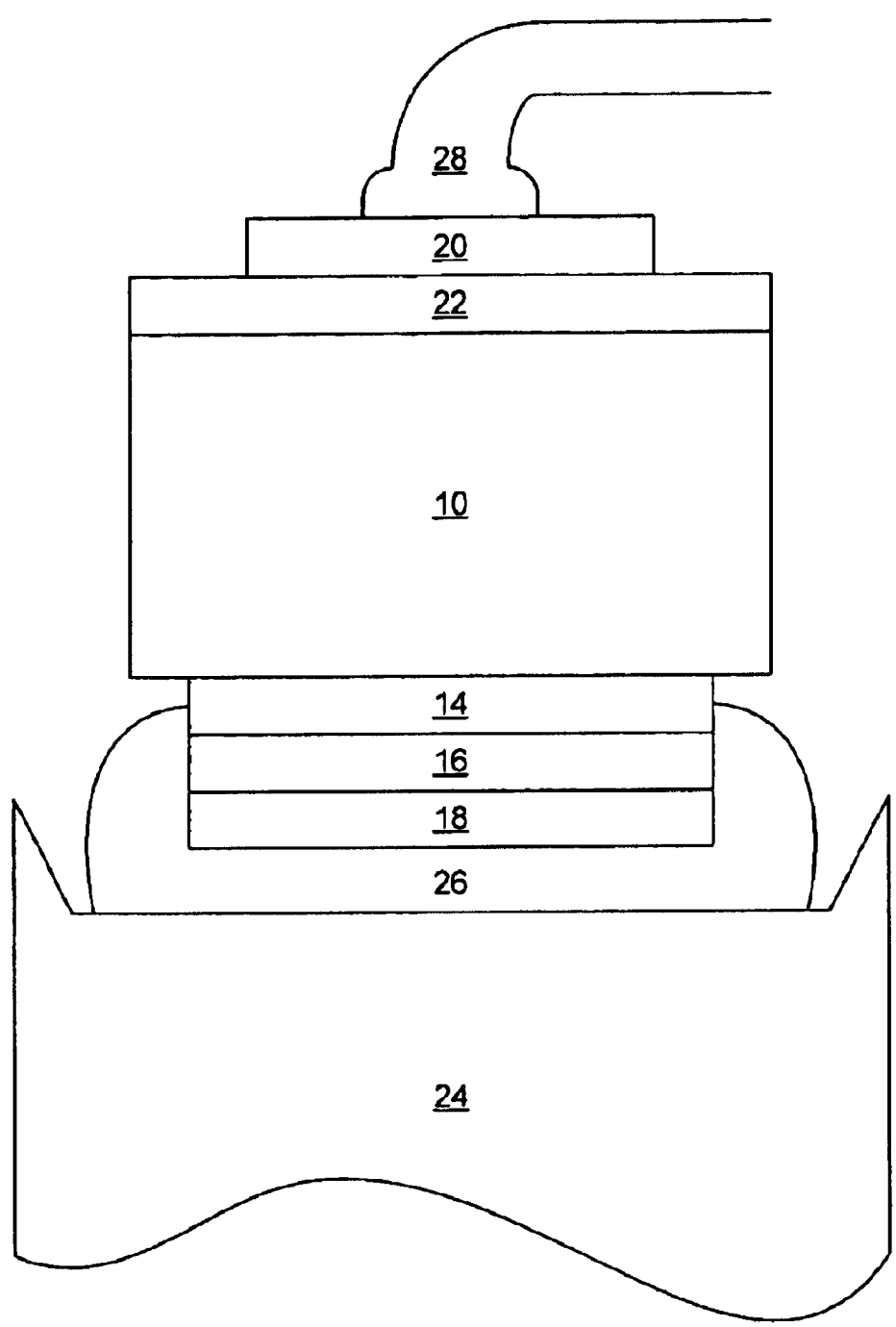
FIG. 2 is a schematic illustration of a flip-chip mounted LED utilizing conventional techniques.
Figure 3:
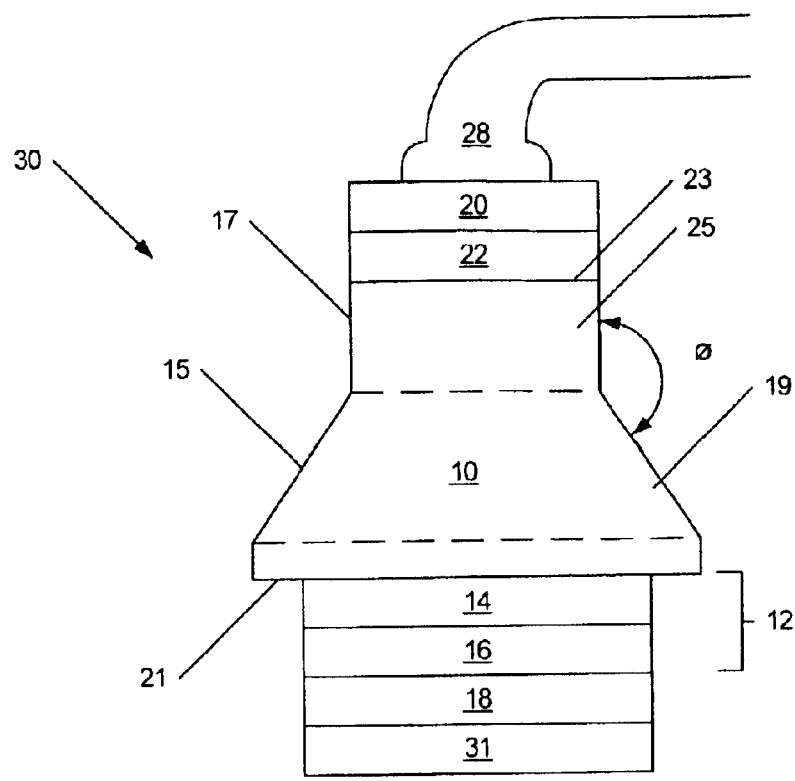
FIG. 3 is a schematic illustration of a LED having a shaped substrate.
Figure 4:
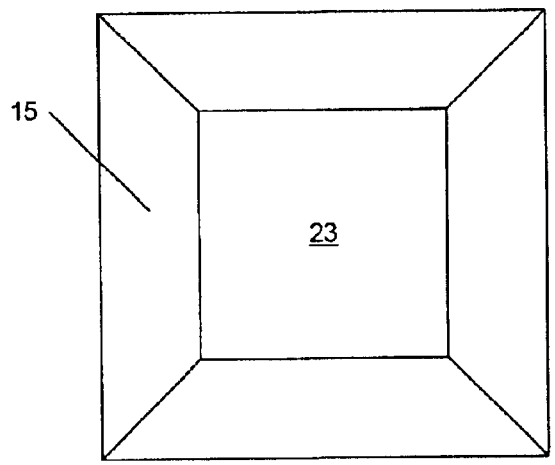
FIG. 4 is a plan view of an LED having a shaped substrate.

FIG. 3 illustrates an LED chip having a shaped substrate such as those described in the above referenced patent application. Specifically, the LED chip 30 shown in FIG. 3 has a substrate 10 having a first surface 21 and a second surface 23. The active region 12 of the light emitting device is formed by a GaN based n-type layer 14 and a p-type GaN based layer 16 on the first surface 21. A p-type electrode 18 is on the p-type GaN based layer 16. The n-type electrode 22 is on the second surface 23 of the substrate 10. Substrate 10 is characterized by the slanted sidewall portions 15 that generally form a truncated pyramid shape 19 such that the base of the truncated pyramid is located adjacent, either directly adjacent or adjacent but spaced apart from, the first surface 21. Shaped substrate 10 is further characterized by a generally cubic section 25 having sidewalls 17, each of which forms an angle θ with an adjacent slanted sidewall portion 15. FIG. 4 shows a plan view of the shaped substrate chip 30 of FIG. 3. The LED chip 30 further includes a metal pad 31 that may be thermosonically bonded to a submount. The metal pad 31 preferably comprises Au or a suitable metal alloy such as Au/Sn or Pb/Sn.

Embodiments of the present invention are described herein with reference to a GaN based LED on a SiC substrate 10 and having a n-type layer 14, a p-type layer 16 and a p-electrode 18. However, the present invention should not be construed as limited to such structures but may be utilized with other structures having a shaped substrate. Light emitting devices for use in embodiments of the present invention may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Application Serial No. 60/294,445, filed May 30, 2001 entitled "MULTI-QUANTUM WELL LIGHT EMITTING DIODE STRUCTURE," U.S. Provisional Application Serial No. 60/294,308, filed May 30, 2001 entitled "LIGHT EMITTING DIODE STRUCTURE WITH SUPERLATTICE STRUCTURE" and U.S. Provisional Application Serial No. 60/294,378, filed May 30, 2001 entitled "LIGHT EMITTING DIODE STRUCTURE WITH MULTI-QUANTUM WELL AND SUPERLATTICE STRUCTURE," as well as U.S. Provisional Application Serial No. 60/265,707, filed Feb. 1, 2001 entitled "Light Emitting Diode With Optically Transparent Silicon Carbide Substrate," U.S. Provisional Application Serial No. 60/307,235, filed Jul. 23, 2001, entitled "Light Emitting Diodes Including Modifications for Light Extraction and Manufacturing Methods Therefor" and U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," the disclosures of which are incorporated herein as if set forth fully.

In particular embodiments of the present invention, the light emitting devices may include a p-electrode that provides a reflecting layer to reflect light generated in the active region back through the device. Reflective p-electrodes and related structures are described in U.S. patent application Ser. No. 10/057,821, entitled "LIGHT EMITTING DIODES INCLUDING SUBSTRATE MODIFICATIONS FOR LIGHT EXTRACTION AND MANUFACTURING METHODS THEREFOR" filed Jan. 25, 2002, which has been incorporated by reference as if set forth fully herein.

Thermosonic bonding is, generally, a technique whereby a device is mounted to a substrate or submount using mechanical vibration, heat and pressure, thereby creating a bond, that may be conductive, between the device and the submount. Thermocompression bonding is, generally, a technique whereby a device is mounted to a substrate or submount using heat and pressure, thereby bonding the device to the substrate. Typically, a vacuum collet is used to pick up the device and physically place it in contact with the submount. Once the device is in contact with the submount, force is applied to the device through the collet, and, for thermosonic bonding, the collet is vibrated. Through a combination of heat, vibration and pressure, the device is thermosonically welded to the submount. In order to form such a bond, a metal pad layer made of a metal, such as Au, that will form a bond when heat, pressure and, optionally, vibration, are applied is utilized. Other potential metals and alloys are Au/Sn and Pb/Sn. The metal pad layer may be provided on the device or a metallic preform may be provided on the submount and the metal pad and/or metallic preform thermosonically bonded and/or thermocompression bonded such that the device and the submount are bonded to each other.

Due to the unique shaping of shaped substrate chips such as the LED chip 30 shown in FIG. 3, a conventional collet design that contacts the sidewalls 17 of the cubic portion 25 may not be desirable. For example, if a conventional collet were used to mechanically vibrate the chip while attached only to cubic portion 25, the shear forces generated during vibration could cause the cubic portion 25 to separate from the chip, rendering the chip useless and lowering production yields.

In light of the above difficulties that may be encountered utilizing conventional vacuum collets to thermosonically bond and/or thermocompression bond light emitting devices having a shaped substrate to a submount, certain embodiments of the present invention provide for bonding a light emitting device having a shaped substrate utilizing a vacuum collet that contacts the shaped substrate in a manner that reduces shear forces in the substrate when the collet applies force to the substrate. Such forces may be reduced to below a failure threshold, such as, for example, a threshold that results in the substrate breaking. The particular failure threshold may depend on the configuration of the shaped substrate and the material from which the substrate is made. Thus, for the shaped substrate of FIG. 3, embodiments of the present invention impart forces to the substrate 10 by contacting at least a portion of the slanted sidewalls 15 of the truncated pyramidal portion 19 of the substrate 10. Examples of collets according to embodiments of the present invention are illustrated in FIGS. 5A through 7 and are described in further detail herein. Such collets contact at least the sidewalls 15 of the truncated pyramidal portion 19 of the substrate 10 and may, optionally, also contact the sidewalls 17 of the cubic portion 25 of the substrate 10.

Figure 5A:
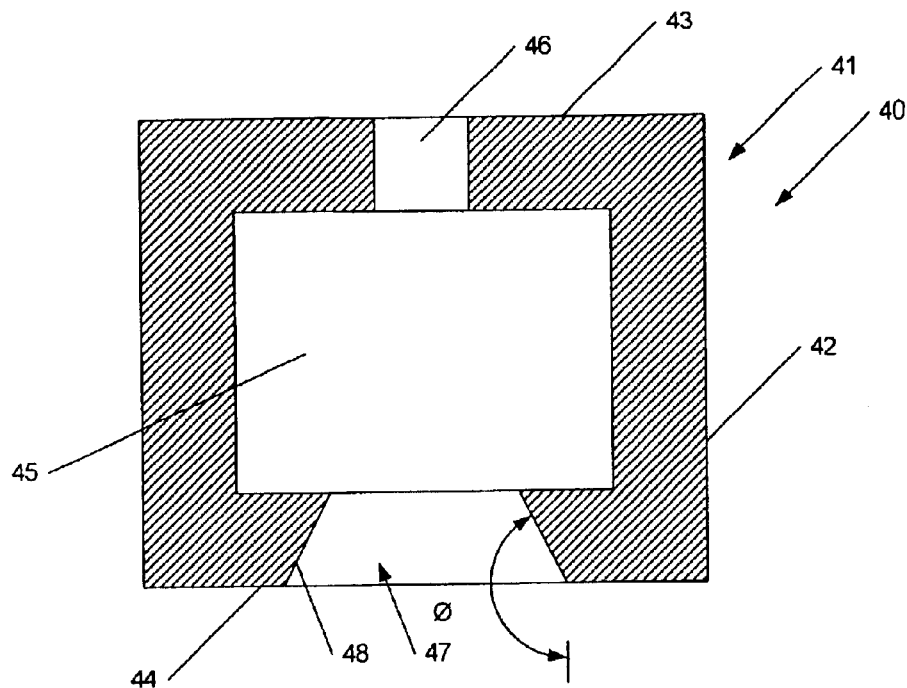
FIGS. 5A and 5B are side and top views of a collet according to embodiments of the present invention.
Figure 5B:
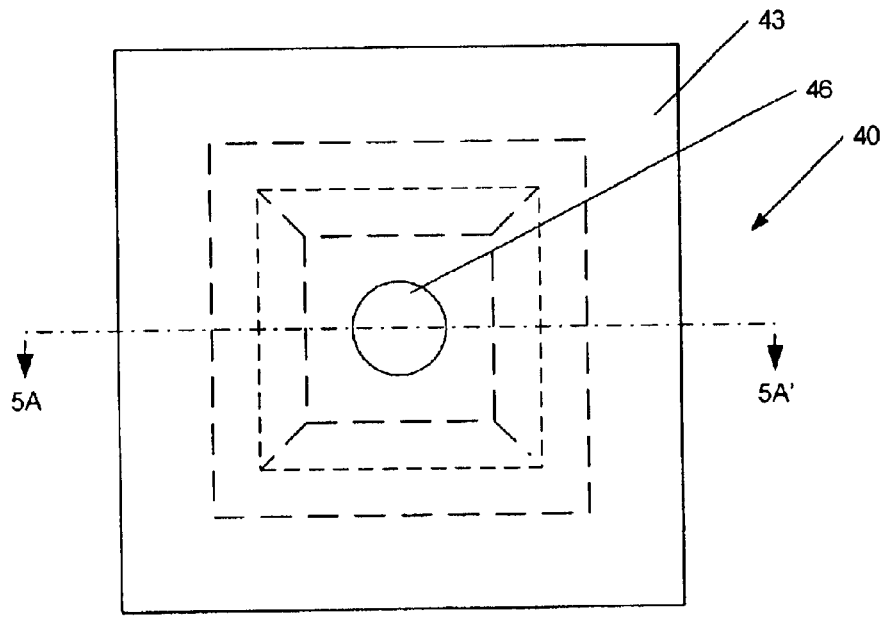

FIGS. 5A and 5B illustrate a collet 40 according to embodiments of the present invention. FIG. 5A is a cross section of the collet 40 illustrated in top-view in FIG. 5B and taken along the line 5A–5A'. The collet 40 includes a body 41 having vertical sidewalls 42 connected to a top wall 43 to form a chamber 45 having an opening 47 in communication with the chamber 45 to receive the light emitting device. Top wall 43 includes an opening 46 to the chamber 45 through which a vacuum is drawn. Horizontal portions 44 extend inward from the sidewalls 42 of collet 40. The horizontal portions 44 have end faces 48 that physically contact the slanted sidewalls 15 of the substrate 10 when the collet is placed over the LED chip 30. The end faces 48 of the horizontal portions 44 may be configured to contact the sidewalls 15 based on the spacing of the horizontal portions 44 and the angle the end faces 48 of the horizontal portions 44 make with respect to a plane connecting opposing ones of either the top or bottom of the end faces 48. If the end faces 48 are the same length, the planes connecting the top or bottom of the end faces will be parallel. The angle the end faces 48 make with the connecting plane may be based on the angle θ that the sidewalls 15 make with the sidewalls 17. This angle may be substantially equal to θ minus 90°. Alternatively, the angle of the end faces may be measured with reference to an axis perpendicular to the connection plane as illustrated in FIG. 4, the angle may be substantially the same as θ. The horizontal portions 44 should be spaced apart a distance sufficient to allow the cubic portion 25 of the LED chip 30 to pass therebetween but not so large that the truncated pyramidal portion 19 also passes therebetween.

The collet 40 may comprise a single unitized member or may include two or more members interconnected to provide the configuration illustrated in FIG. 5. Furthermore, the collet 40 may be made of a metallic material, such as aluminum, steel or the like or may be made of a non-metallic material, such as a plastic, ceramic or other such non-metallic material. The collet 40 may be fabricated by casting, machining, molding, combinations thereof or other such suitable fabrication process.

In operation, the collet 40 is placed over the LED chip 30 such that the cubic portion 25 of the substrate 10 extends into the chamber 45 and the end faces 48 contact the sidewalls 15 of the substrate 10. By contact with the end faces 48, a tight seal may be formed between end faces 48 of the collet 40 and slanted sidewall portions 15 of the LED chip 30. Vacuum pressure applied to the collet 40 through the opening 46 establishes a lower pressure area within the changer 45 and serves to hold the LED chip 30 securely in place while it is being manipulated.

Movement of the collet 40 may be utilized to thermosonically bond the LED chip 30, however, the forces applied to the LED chip 30 are applied to the slanted sidewalls 15, thereby reducing shear forces at the boundary between the cubic portion 25 and the truncated pyramidal portion 19 of the substrate 10. Thus, in certain embodiments of the present invention, the LED chip 30 is thermosonically bonded by application of forces by contacting a surface of the substrate 10 of the chip 30 that is oblique to the direction of motion of the LED chip 30. The angle of contact with the substrate 10 through which force is applied to the LED chip 30 may be either acute or obtuse to the direction of movement.

Similarly, the LED chip 30 may be thermocompression bonded utilizing the collet 40 by application of force to the pyramidal portion 19 of the substrate 10. Such force may be applied through the end faces 40 of the collet 40.

Figure 6:
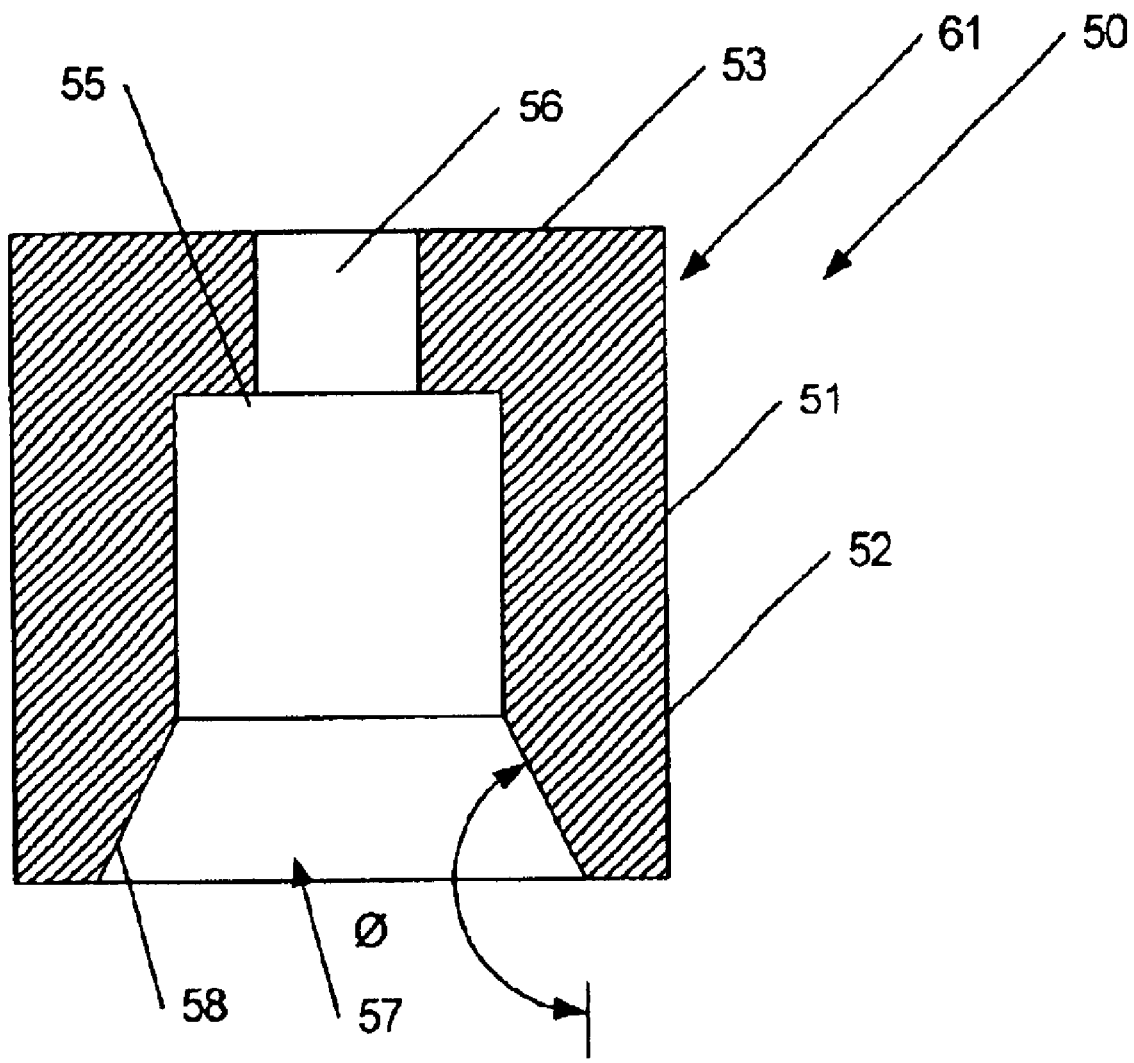
FIG. 6 is a side view of a collet according to further embodiments of the present invention.
Figure 7:
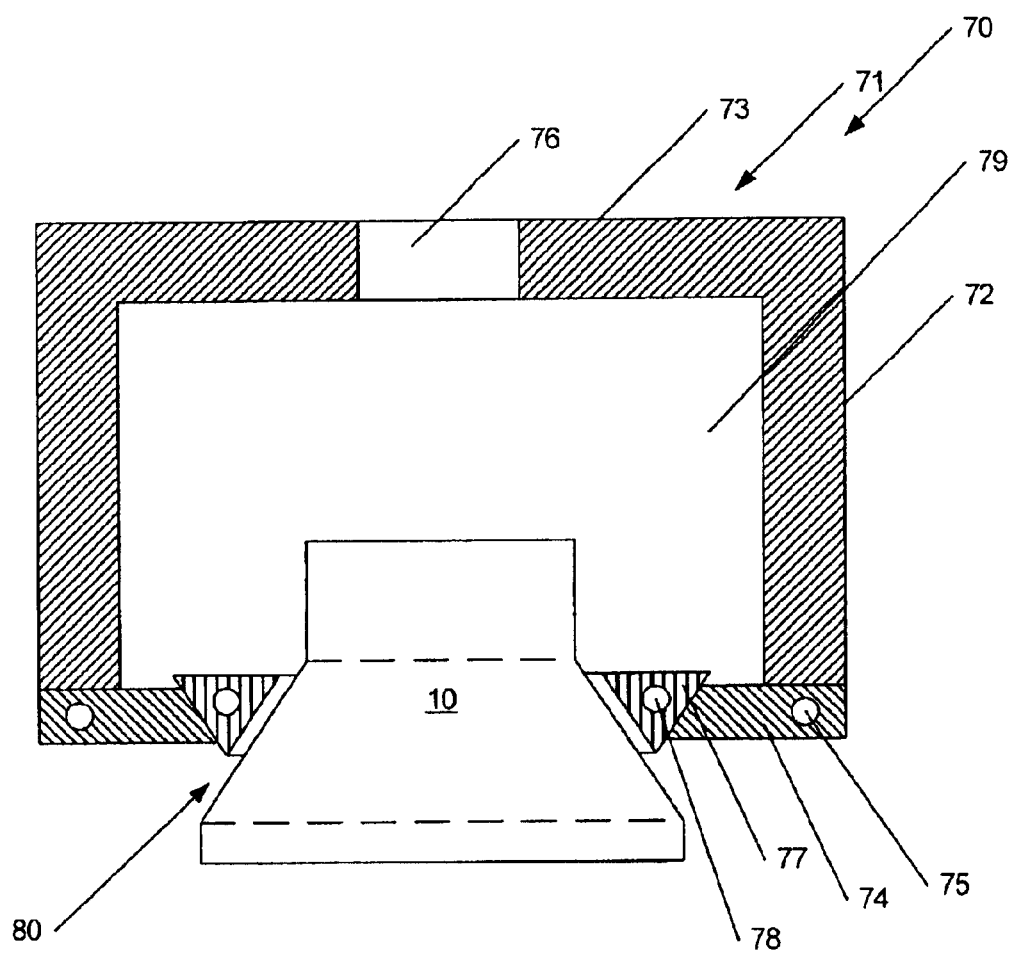
FIG. 7 is a side view of a collet according to further embodiments of the present invention.

Collet designs according to further embodiments of the present invention are illustrated in FIGS. 6 and 7. In FIG. 6, the horizontal portions 44 of FIG. 5 have been replaced in the collet 50 illustrated in FIG. 6 by the terminating faces of the side portions 51. The collet 50 has a body 61 that includes vertical sidewalls 52 connected to a top wall 53 to form a chamber 55 and an opening 57 in communication with the chamber 55 that receives the light emitting device. Top wall 53 includes an opening 56 to the chamber 55 through which a vacuum is drawn. As seen in FIG. 6, the vertical sidewalls 52 of the side portions 51 terminate in slanted end faces 58. The end faces 58 of the side portions 51 may be configured to contact the sidewalls 15 based on the spacing of the side portions 51 and the angle the end faces 58 of the side portions 51 make with respect to a plane connecting opposing ones of either the top or bottom of the end faces 58. If the end faces 58 are the same length, the planes connecting the top or bottom of the end faces will be parallel. The angle the end faces 58 make with the connecting plane may be based on the angle θ that the sidewalls 15 make with the sidewalls 17. This angle may be substantially equal to θ-90°. Alternatively, the angle of the end faces 58 may be measured with reference to an axis perpendicular to the connection plane as illustrated in FIG. 6, the angle may be substantially the same as θ. The side portions 51 should be spaced apart a distance sufficient to allow the cubic portion 25 of the LED chip 30 to pass therebetween but not so large that the truncated pyramidal portion 19 also passes therebetween.

The collet 50 may comprise a single unitized member or may include two or more members interconnected to provide the configuration illustrated in FIG. 6. Furthermore, the collet 50 may be made of a metallic material, such as aluminum, steel or the like or may be made of a non-metallic material, such as a plastic, ceramic or other such non-metallic material. The collet 50 may be fabricated by casting, machining, molding, combinations thereof or other such suitable fabrication process. FIG. 7 illustrates a further collet 70 according to embodiments of the present invention, In the collet 70 of FIG. 7, the horizontal portions 74 comprise hinged end sections 77 that permit the collet 70 to form a tight seal with the slanted portions 15 of the LED chip 30 even if the collet is slightly misaligned or the angles of slanted sidewalls 15 are slightly off with respect to the angles of the moveable end sections 77. The collet 70 has a body 71 that include vertical sidewalls 72 connected to a top wall 73 to form a chamber 79 and an opening 80 in communication with the chamber 79 so as to receive the light emitting device substrate 10 as illustrated in FIG. 7. Top wall 73 includes an opening 76 to the chamber 79 through which a vacuum is drawn. As seen in FIG. 7, the horizontal portions 74 may be hinged about the respective pivot points 75 so as to rotate about the respective pivot points 75. Similarly, end sections 77 may be hinged to pivot about the pivot points 78 so as to allow the end sections 77 to mate to the oblique surface of the slanted portions 15 of the LED chip 30.

The collet 70 may comprise portions of single unitized members or may include two or more members interconnected to provide the configuration illustrated in FIG. 7. Furthermore, the collet 70 may be made of a metallic material, such as aluminum, steel or the like or may be made of a non-metallic material, such as a plastic, ceramic or other such non-metallic material. The collet 70 may be fabricated by casting, machining, molding, combinations thereof or other such suitable fabrication process.

For the collets according to embodiments of the present invention, as exemplified by the collets 40, 50 and 70, the size of the openings 46, 56 and 76 may be large enough to overcome any imperfections in the mating of the collet 40, 50 or 70 to the substrate 10 such that the lower pressure area may be maintained. Such sizing may require different configuration of the collet 40, for example, to allow a larger opening for application of the vacuum pressure. Thus, the particular configuration of the collet may be modified such that a majority of the pressure drop between the opening 46, 56 or 76 and the outer environment is provided across any openings or imperfections in the region of contact between the collet and the substrate 10. In such a way the substrate 10 may be maintained in the collet 40, 50 or 70 through the application of vacuum pressure for movement and/or bonding.

As described above, embodiments of the present invention provide means for mating surfaces of a collet to a shaped substrate. Embodiments of the present invention also provide means for engaging the substrate while maintaining internal shear forces of the substrate below about a shear failure threshold of the substrate when force is applied to the shaped substrate to thermosonically bond the light emitting diode to the submount. The means for mating and/or means for engaging the substrate may be provided by fixed surfaces of a collet or by moveable, adjustable and/or conforming surfaces that contact a shaped substrate at an oblique angle with regard to motion of the collet. Furthermore, while the present invention has been described with reference to a rectangular chamber formed by the collet other shapes could be utilized. Thus, for example, a pyramidal chamber may be formed or any other shape that provides a cavity into which the light emitting diode may be received.

In further embodiments of the present invention, systems for thermosonically and/or thermocompression bonding a light emitting diode having a shaped substrate to a submount are provided. In particular systems, the above described collets may be used with conventional systems for thermosonic and/or thermocompression bonding. Thus, the conventional system may provide means for moving the collets to apply force to the substrates to thermosonically bond and/or thermocompression bond the light emitting diode to the submount.

Furthermore, while embodiments of the present invention have been described with reference to a shaped substrate having a cubic portion and a truncated pyramidal portion, other shapes of substrates may be utilized with corresponding changes in shapes to the periphery of the chamber. Thus, for example, the substrate may include a cylindrical portion and a frusto-conical portion and/or a conical portion. In such cases, embodiments of the present invention may provide a chamber with a substantially circular opening where the sidewalls of the opening are configured to mate with the sidewalls of the conical and/or frusto-conical portions of the substrate. Thus, embodiments of the present invention should not be construed as limited to the particular shapes described herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A collet for manipulating a light emitting device having a shaped substrate during banding of the light emitting device having the shaped substrate to a submount, comprising:
   a body having a chamber;
   an opening in communication with the chamber and adapted to receive the light emitting device; and
   means for mating surfaces of the collet to surfaces of the shaped substrate that are oblique to a direction of motion of the collet during bonding of the light emitting device to the submount.

2. The collet of claim 1, wherein the means for mating surfaces of the collet to the shaped substrate comprises fixed surfaces of the collet defining the opening and disposed at an angle corresponding to an angle of the surfaces of the shaped substrate that are oblique to the direction of motion.

3. The collet of claim 2, wherein the body comprises a top portion and vertical side portions defining the chamber and an opening for inducing a vacuum in the chamber.

4. The collet of claim 2, wherein the body comprises spaced apart side portions defining the chamber and wherein the fixed surfaces of the collet comprise angled surfaces at a terminus of the side portions, wherein the side portions are spaced apart a distance corresponding to a dimension of the surfaces of the shaped substrate that are oblique to the direction of motion.

5. The collet of claim 4, wherein the body further comprises a top portion and an opening for inducing a vacuum pressure in the chamber and wherein the side portions are vertical side portions.

6. The collet of claim 4, wherein the body comprises a top portion and vertical side portions defining the chamber and an opening for inducing a vacuum in the chamber and wherein the side portions are horizontal side portions that extend from the vertical side portions and are spaced apart from the top portion.

7. The collet of claim 1, wherein the means for mating surfaces of the collet to the shaped substrate comprises surfaces of the collet defining the opening and that are moveable with respect to the body and are configured to adjust to an angle corresponding to an angle of the surfaces of the shaped substrate that are oblique to the direction of motion.

8. The collet of claim 7, wherein the body comprises a top portion and vertical side portions defining the chamber and an opening for inducing a vacuum in the chamber.

9. The collet of claim 7, wherein the body comprises spaced apart horizontal side portions and wherein the moveable surfaces of the collet comprise moveable end portions of the horizontal side portions, the moveable end portions being configured to substantially conform to the angle of the shaped substrate, wherein the moveable end portions are spaced apart a distance corresponding to a dimension of the surfaces of the shaped substrate that are oblique to the direction of motion.

10. The collet of claim 9, wherein the moveable end portions are hinged to rotate about an end of the horizontal side portions.

11. The collet of claim 10, wherein the body further comprises a top portion and vertical side portions that connect the top portion to the horizontal side portions defining the chamber and an opening for inducing a vacuum pressure in the chamber.

12. The collet of claim 11, wherein the horizontal side portions are moveably connected to the vertical side portions.

13. The col let of claim 12, wherein the horizontal side portions are hinged to the vertical side portions.

14. The collet of claim 1, wherein the collet is adapted for use with a gallium nitride based light emitting diode having a silicon carbide shaped substrate.

15. The collet of claim 1, wherein the collet is adapted for use with a silicon carbide shaped substrate having a cubic portion and a truncated pyramidal portion adjacent the cubic portion and wherein the means for mating comprises means for mating surfaces of the collet to sidewalls of the truncated pyramidal portion of the shaped silicon carbide substrate.

16. A collet for manipulating a light emitting device having a shared substrate during bonding of the light emitting device having the shaped substrate to a submount, comprising:
    a body having a chamber;
    an opening in the body in communication with the chamber configured such that a portion of the shaped substrate extends into the chamber without contacting the body; and
    means, operably associated with the chamber, for engaging the substrate to bond the light emitting device to the submount while maintaining internal shear forces of the substrate resulting from manipulation of the substrate below a shear failure threshold of the substrate.

17. The collet of claim 16, wherein the means for engaging comprises fixed surfaces of the collet defining the opening and disposed at an angle corresponding to an angle of the surfaces of the shaped substrate that are oblique to the direction of motion.

18. The collet of claim 17, wherein the body comprises a top portion and vertical side portions defining the chamber and an opening for inducing a vacuum in the chamber.

19. The collet of claim 17, wherein the body comprises spaced apart side portions defining the opening and wherein the fixed surfaces of the collet comprise angled surfaces at a terminus of the side portions, wherein the side portions are spaced apart a distance corresponding to a dimension of the surfaces of the shaped substrate that are oblique to the direction of motion.

20. The collet of claim 19, wherein the body further comprises a top portion defining the chamber and an opening for inducing a vacuum in the chamber and wherein the side portions are vertical side portions.

21. The collet of claim 19, wherein the body further comprises a top portion and vertical side portions and an opening for inducing a vacuum in the chamber and wherein the side portions are horizontal side portions that extend from the vertical side portions and are spaced apart from the top portion.

22. The collet of claim 16, wherein the means for engaging comprises moveable surfaces of the collet defining the opening and configured to adjust to an angle corresponding to an angle of the surfaces of the shaped substrate that are oblique to the direction of motion.

23. The collet of claim 22, wherein the body comprises a top portion and vertical side portions defining the chamber and an opening for inducing a vacuum in the chamber.

24. The collet of claim 22, wherein the body comprises spaced apart horizontal side portions and wherein the moveable surfaces of the collet comprise moveable end portions of the horizontal side portions, the moveable end portions being configured to substantially conform to the angle of the shaped substrate, wherein the moveable end portions are spaced apart a distance corresponding to a dimension of the surfaces of the shaped substrate that are oblique to the direction of motion to thereby define the opening.

25. The collet of claim 24, wherein the moveable end portions are hinged to rotate about an end of the horizontal side portions.

26. The collet of claim 25, wherein the body further comprises a top portion and an opening for inducing a vacuum in the chamber and vertical side portions that connect the top portion to the horizontal side portions.

27. The collet of claim 26, wherein the horizontal side portions are moveably connected to the vertical side portions.

28. The collet of claim 27, wherein the horizontal side portions are hinged to the vertical side portions.

29. A collet for manipulating a light emitting device during bonding of the light emitting device to a submount, comprising:
    a body having a chamber therein;
    an opening in the body in communication with the chamber and configured to receive the light emitting device; and
    fixed surfaces of the collet at the opening that contact a shaped substrate of the light emitting device, the fixed surfaces defining the opening and being disposed at an angle corresponding to an angle of the surfaces of the shaped substrate that are oblique to a direction of motion of the collet during bonding of the light emitting device to the submount.

30. The collet of claim 29, wherein the body comprises a top portion and vertical side portions defining the chamber and an opening for inducing a vacuum in the chamber.

31. The collet of claim 29, wherein the body comprises spaced apart side portions and wherein the fixed surfaces of the collet comprise angled surfaces at a terminus of the side portions, wherein the side portions are spaced apart a distance corresponding to a dimension of the surfaces of the shaped substrate that are oblique to the direction of motion.

32. The collet of claim 31, wherein the body further comprises a top portion defining the chamber and an opening for inducing a vacuum in the chamber and wherein the side portions are vertical side portions.

33. The collet of claim 31, wherein the body further comprises a top portion and vertical side portions defining the chamber and an opening for inducing a vacuum in the chamber and wherein the side portions are horizontal side portions that extend from the vertical side portions and are spaced apart from the top portion.

34. The collet of claim 1, wherein the light emitting device comprises a laser.

35. The collet of claim 16, wherein the light emitting device comprises a laser.

36. The collet of claim 29, wherein the light emitting device comprises a laser.

* * * * *

UNITED STATES PATENT AND TRADEMARK OFFICE
CERTIFICATE OF CORRECTION

PATENT NO. : 6,747,298 B2
DATED : June 8, 2004
INVENTOR(S) : Slater, Jr. et al.

It is certified that error appears in the above-identified patent and that said Letters Patent is hereby corrected as shown below:

Column 12,
Line 12, should read -- a shaped substrate during bonding of the light emitting --.

Column 13,
Line 9, should read -- 13. The collet of claim 12, wherein the horizontal side --.

Signed and Sealed this

Eleventh Day of April, 2006

JON W. DUDAS
*Director of the United States Patent and Trademark Office*